United States Patent [19]

Yaron et al.

[11] Patent Number: 4,477,825

[45] Date of Patent: Oct. 16, 1984

[54] ELECTRICALLY PROGRAMMABLE AND ERASABLE MEMORY CELL

[75] Inventors: Giora Yaron; Ying K. Shum; Ury Priel, all of Cupertino; Jayasimha S. Prasad, Sunnyvale; Mark S. Ebel, Santa Clara, all of Calif.

[73] Assignee: National Semiconductor Corporation, Santa Clara, Calif.

[21] Appl. No.: 334,700

[22] Filed: Dec. 28, 1981

[51] Int. Cl.[3] .................... H01L 29/78; H01L 27/02; H01L 29/06; H01L 29/04

[52] U.S. Cl. ................................ 357/23.5; 357/23.9; 357/41; 357/55; 357/59; 365/185

[58] Field of Search ................ 357/23 VT, 41, 55, 59, 357/23 S; 365/185

[56] References Cited

U.S. PATENT DOCUMENTS

| | | | |
|---|---|---|---|
| 4,128,773 | 12/1978 | Troutman et al. | 365/185 |
| 4,162,504 | 7/1979 | Hsu | 357/23 VT |
| 4,180,826 | 12/1979 | Shappin | 357/41 |
| 4,203,158 | 5/1980 | Frohman-Bentchowsky | 357/23 VT |
| 4,300,212 | 11/1981 | Simko | 357/23 VT |
| 4,302,766 | 11/1981 | Guterman et al. | 357/23 VT |
| 4,363,109 | 12/1982 | Gardner, Jr. | 357/23 VT |
| 4,377,857 | 3/1983 | Tickle | 357/23 VT |

*Primary Examiner*—Andrew J. James
*Assistant Examiner*—J. Carroll
*Attorney, Agent, or Firm*—Paul J. Winters; Gail W. Woodward; Michael J. Pollock

[57] ABSTRACT

An electrically programmable and eraseable memory cell in which charge carriers are tunnelled between a floating gate and a drain region in the substrate through a thin oxide tunnel region, the borders of said tunnel region being confined to a small area well inside the borders of both the drain region and the floating gate. Dual paths are utilized to connect the tunnel region of the gate to the memory cell region of the gate.

10 Claims, 14 Drawing Figures

FIG. 1
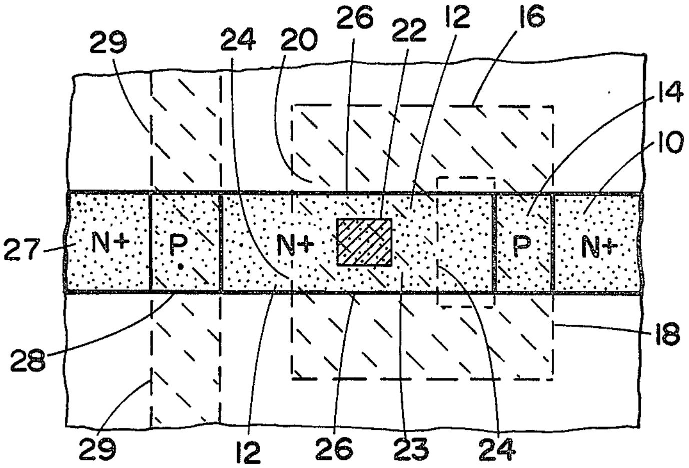
FIG. 2
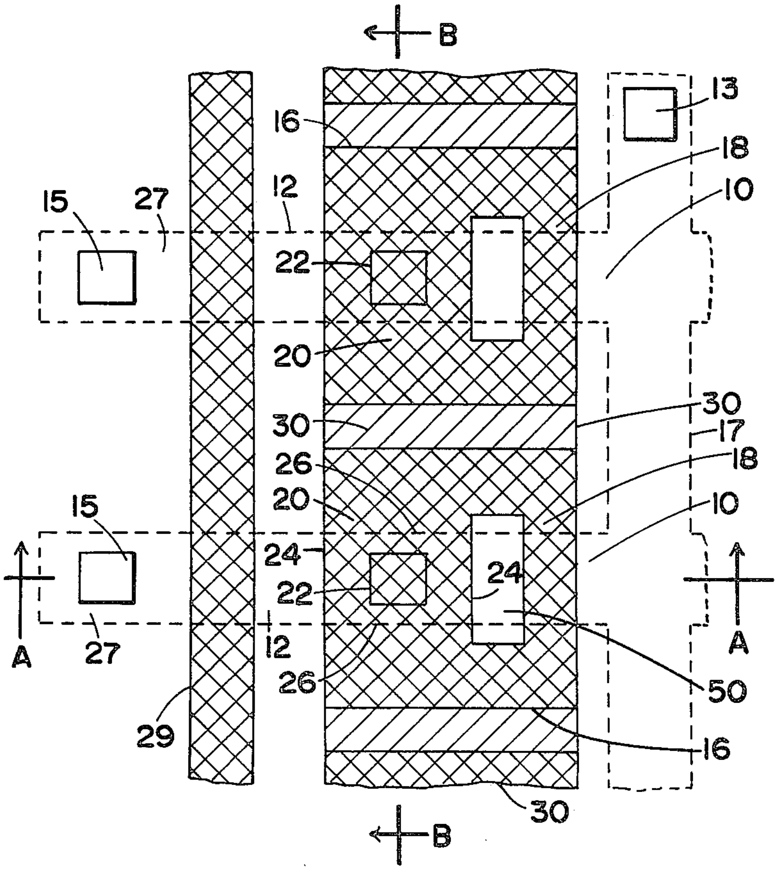
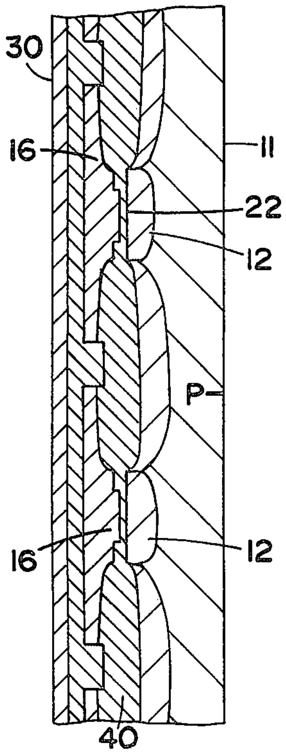
FIG. 2B
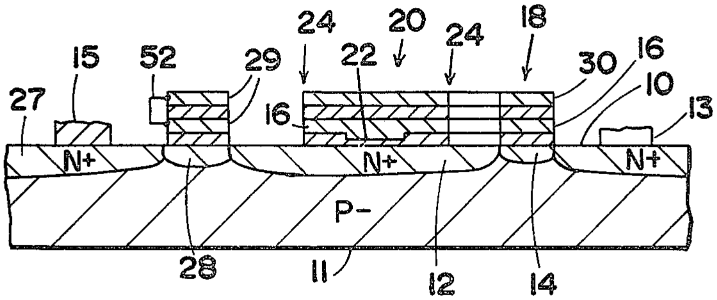
FIG. 2A

ELECTRICALLY PROGRAMMABLE AND ERASABLE MEMORY CELL

BACKGROUND OF THE INVENTION

The prior art recognizes semiconductor memory cells that utilize field effect transistors formed on a substrate so as to control current flow through a channel region between source and drain regions. A control gate overlays a floating gate which overlays the channel region. To read the cell, the control gate is typically charged (positive in the case of an N channel device) to draw electrons into the channel and permit current flow. However, this effect may be blocked by the floating gate positioned between the channel and the control gate. The floating gate influences the current flow in the channel as a function of the charge trapped on the floating gate. The memory cell is programmed by tunnelling charge carriers on or off the floating gate with suitably applied electric fields that act across carefully dimensioned thin oxide layers, the size and thickness of which are critically important to proper operation.

Numerous design objectives need to be met with these memory cells. These different objectives are often inherently conflicting. For example, the floating gate acts on the channel with electric fields and thus must be capacitively coupled to the channel. It is important that this capacitance be well known and predictable in order to have reliable and consistent operation. However, the prior art thin oxide layers, where tunnelling takes place, are notoriously unpredictable in this respect, because they are so thin, typically less than 200 angstroms. Their thinness enhances their share of the total capacitance while at the same time, making the magnitude of that share unpredictable. In addition, the thin oxide tunnel regions, being so thin, are physically fragile and defects are easily introduced by any environmental stress they encounter during manufacture.

A typical prior art cell is exemplified by U.S. Pat. No. 4,162,504. This patent teaches the use of a narrower floating gate which does not extend completely across the channel region and thus avoids alignment with the edges of the source and drain regions. The gate is thereby isolated from possible avalanche breakdown at the junction. This solution is not satisfactory, however, because of insufficient capacitive coupling between the floating and control gates in practical cell sizes. Also the thin oxide is coextensive with the floating gate which is objectionable as will be discussed hereinafter.

Another prior art approach is taught in U.S. Pat. No. 4,203,158 which proposes to reduce the thin oxide tunnelling area to a small fraction of device area (column 1, line 66) by moving it to a "third region". Several different embodiments are suggested with several different locations for this third region, all of which suffer from some problems. For example, in FIG. 1, the third region 14*a* is located at a PN junction and thus could be subjected to the avalanche breakdown problem discussed in U.S. Pat. No. 4,162,504. In FIG. 2, another third region location 36 is contemplated, again at a PN junction possibly subject to avalanche breakdown. Also, this layout would create a larger cell. As disclosed, the cell is incapable of being erased without adding a fourth electrical connection to region 36 which would make the cell very large indeed. Still another third region location is taught in FIGS. 3 and 4, again at the objectionable location near both junctions and also along the sides of the active channel next to the field oxide (column 6, lines 5–21) which location is also objectionable as will be explained in detail later. Finally, U.S. Pat. No. 4,203,158 describes the preferred, and perhaps the worst, location for the third region in FIG. 5, namely, displaced off to the side at region 60. Region 60, being off to one side, causes the whole memory cell to be much larger, thus reducing the density of components on the chip and necessitating larger chips. Also troublesome is the fact the edges of the thin oxide layer are determined by the edges of the field oxide (column 7, line 63–67) which creates many problems. Firstly, the edge of the field oxide layer is an area of high mechanical stress that can degrade the fragile thin oxide layer and introduce uncertainties in performance. Secondly, there are often trace amounts of silicon nitride left over at the edge of the field oxide from previous operations which degrades the quality of the thin oxide at this point. Thirdly, the actual location of the field oxide edge is less controllable and results in additional uncertainties in the size of the thin oxide area.

Still further problems are created when U.S. Pat. No. 4,203,158 etches the two layers of polysilicon for the gate line 52 in FIG. 12. This etching step inevitably attacks the edges of the delicate and fragile thin oxide layer. The problem is so serious, that it is even mentioned in column 9 of U.S. Pat. No. 4,203,158 where a "blanket" is proposed to protect the thin oxide during subsequent manufacturing steps. The present invention avoids all of the above problems with the novel layout described hereinafter.

SUMMARY OF THE INVENTION

Briefly, the present invention utilizes a one step etch process to locate and define a thin oxide tunnelling region, the borders of which are located interior to and displaced from the borders of both the field oxide layer and the edges of the overlaying gates. This interior location is accomplished by using a unique, compact, in line layout geometry with two portions to the floating gate, the two portions connected together by dual paths positioned on each side of the source to drain current path. One portion of the gate operates over the channel region as a memory transistor while the other portion contains the tunnelling region. This layout provides a high cell packing density and simultaneously segregates the thin oxide region from areas of objectionable mechanical and electrical stress. Also, the thin oxide is protected from future, edge degrading, etching steps. Still further, the absolute size of the thin oxide region is more predictable, thus, giving higher production yields and improved performance.

BRIEF DESCRIPTION OF THE DRAWINGS

FIG. 1 is a schematic plan view of a typical memory cell constructed according to one embodiment of the present invention.

FIG. 2 is an expanded plan view showing two of the cells of FIG. 1 and emphasizing different layer elements thereof.

FIGS. 2A and 2B are elevational sectional views of the important structure of FIG. 2 taken respectively along lines A—A and B—B in FIG. 2.

FIGS. 3A through 8A illustrate various stages of the device in preparation viewed in elevational section from the same direction as FIG. 2A.

FIGS. 3B through 6B illustrate the same numbered stages of the device in apparatus as FIGS. 3A through 6A, but viewed from the same direction as FIG. 2B.

DESCRIPTION OF THE PREFERRED EMBODIMENT

Figure 3A:
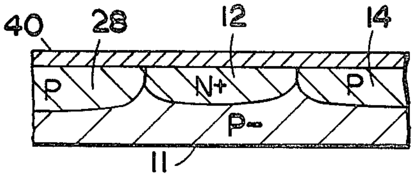

In FIG. 1, a typical memory cell is schematically diagrammed having a N+ type source region 10 and a N+ type drain region 12 spaced apart by a P type channel region 14. Regions 10, 12 and 14 are shown dotted in FIG. 1. Current flow in channel 14 is influenced by a floating gate 16 that has a first portion 18 overlaying channel 14, to form a memory transistor, and a second portion 20 within which a thin oxide tunnel region 22 may be located. The area where floating gate 16 overlaps region 12 may be thought of as an overlap region 23 defined dimensionally in one direction by the borders 24 of portion 20 of floating gate 16, and in the other direction by borders 26 of drain region 12. The borders of thin oxide tunnel region 22 are caused to be interior to and displaced from borders 24 and 26 by the process of manufacture as will be explained hereinafter.

Region 12 also serves as a source region in cooperation with a N+ type drain region 27 spaced therefrom by a P type channel region 28 so as to form a select transistor in series with the memory transistor. Current in channel 28 is controlled by an overlaying select gate 29.

Portions 18 and 20 of gate 16 are connected together on both sides of channel 14, which increases the area of floating gate 16 and enhances its capacitive coupling with the overlaying control gate 30 as can be seen in FIG. 2.

FIGS. 2, 2A, and 2B show a pair of memory cells of the type diagrammed in FIG. 1. The source regions 10 are formed in a conventional manner in the surface of a substrate 11 and connected together by a common source region 17 to a suitable contact 13. Drain regions 27 are provided with contacts 15. Each cell has an individual floating gate 16 with a portion 18 over channel 14 and a portion 20 over region 12. A single continuous control gate 30 overlays all of the floating gates 16 in the row.

An individual cell is selected and read by applying a voltage to the correct column contact 15 and also to the row containing the correct control gate 30 and select gate 29. If the floating gate 16 over the selected cell is charged negative, the positive voltage on control gate 30 cannot induce current to flow in channel 14. But if there is no negative charge on floating gate 16, the positive voltage on gate 30 induces inversion in channel 14 and current flows therein. Likewise, the positive voltage on select gate 29 induces current in channel 28. The presence of current flow from contact 15 to contact 13 is therefore an indication of the absence or presence of charge on floating gate 16.

Gate 16 is charged, or programmed, by tunnelling electrons through a thin oxide layer 22 from region 12. Thin oxide layer 22 should be less than 200 angstroms thick and thus is very difficult to manufacture reliably and consistently. The arrangement employed by this invention, however, permits the creation of a consistent thin oxide layer by keeping the borders of region 22 inside borders 24 and 26 with the method of manufacture described in FIGS. 3A to 8A.

Figure 3B:
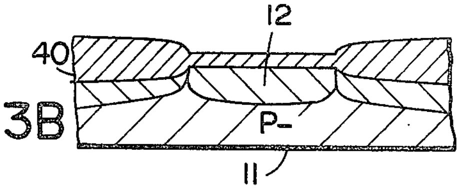
Figure 4A:
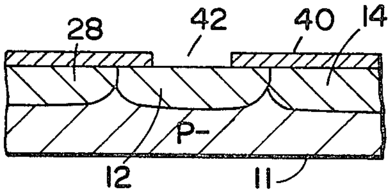
Figure 4B:
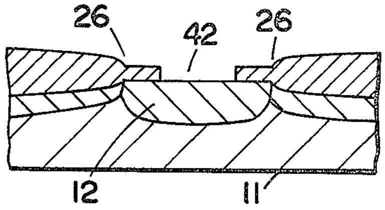

First, a substrate 11 of one conductivity type, P in the embodiment shown, is masked and implanted through a series of conventional steps well known to those skilled in the art, so as to have a N+ region 12 flanked on both sides, in the source to drain direction, by P regions (which will become channels 28 and 14 in the finished device) and covered by an oxide layer 40 as shown in FIG. 3A. Oxide layer 40 is particularly thick in the field areas on both sides of the channels and includes a P+ region underneath as shown in FIG. 3B. Next, a small precisely defined hole 42 is etched in the oxide 40, as shown in FIGS. 4A and 4B. The edges of hole 42 are well inside and away from the borders 26 of the thick oxide portion of layer 40, as shown in FIG. 4B. This separation is achieved by using a separate etching step to create hole 42 in the exact location and size needed to avoid the edges of the thick oxide layer.

Figure 5A:
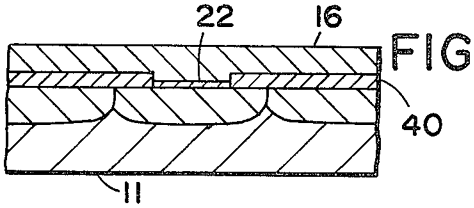
Figure 5B:
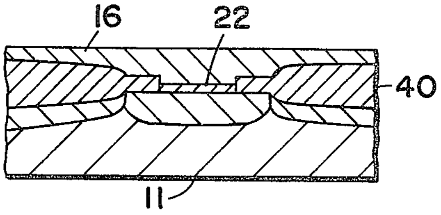

As shown in FIGS. 5A and 5B, the thin oxide layer 22 may now be grown in hole 42, clear of the deleterious effects of the edges of the thick oxide and immediately covered by a polycrystalline silicon layer 16. Thin oxide 22 is now sealed in and protected by polysilicon layer 16, and thus sheltered from all future stresses, etches, and other processes that could harm the fragile and delicate thin oxide layer 22.

Slots are now etched in layer 16, to divide it into the individual floating polysilicon gates 16, and an interpoly oxide layer 44 is formed over the gates 16 to fully isolate them. Then a second polysilicon layer 30 is formed over oxide layer 44 to provide a conducting layer from which control gates 30 may be formed. The result and structure is shown in FIGS. 6A and 6B.

Figure 6A:
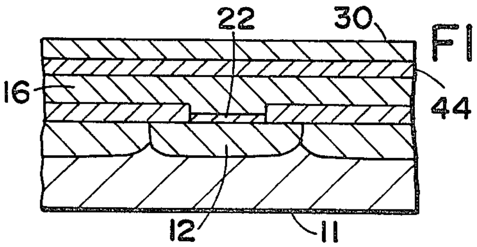
Figure 6B:
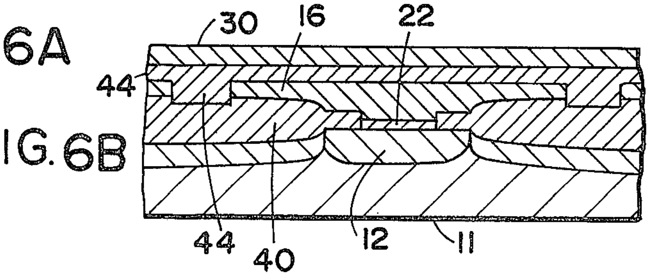
Figure 7A:
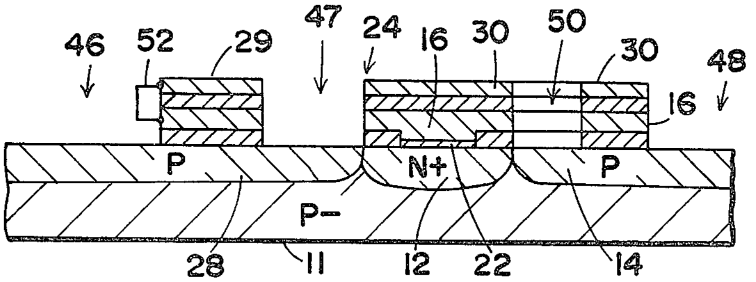

In FIG. 7A, the structure of FIGS. 6A and 6B has been masked and etched back creating slots 46, 47, and 48 and a hole 50. This etching step aligns floating gate 16 with control gate 30 and is masked so that edges 24 of the gates are outside and displaced from thin oxide region 22. Consequently, the thin oxide is not subjected to any etching action at its borders which could easily attack and disrupt the thin oxide.

In FIG. 7A, it may be seen that slots 46 and 47 operate to segregate parts of polysilicon layer 16 and 30, thus creating a dual stacked select gate 29. By forming select gate 29 with one self aligning etch step, and as a stacked structure, select gate 29 can be positioned closer to the memory transistor thus achieving higher cell density and a smaller chip size. The upper and lower portions of select gate 29 are electrically connected together by a suitable buried contact, or other means well known to those skilled in the art, shown schematically in the drawings by the connection 52.

Figure 8A:
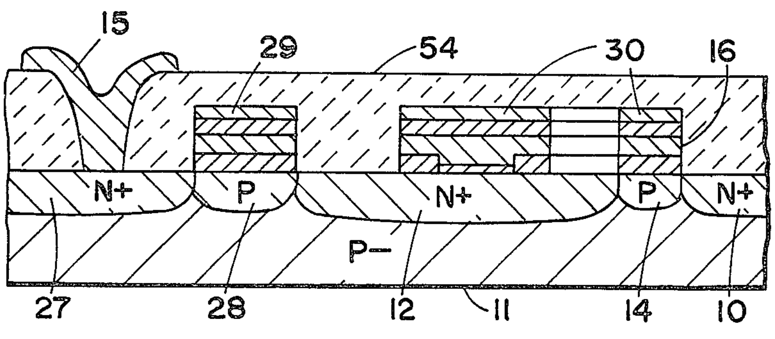

A suitable ion implant can now be done through openings 46, 47, 48 and 50, in FIG. 7A, so as to expand N+ region 12 and create N+ regions 27 and 10 as shown in FIGS. 8A and 2A. The P regions 28 and 14 are concurrently reduced in size to become the channels under the select transistor and memory transistor respectively as shown in FIGS. 2A and 8A. FIG. 8A also shows how the device may be completed by forming another protective insulating layer 54 over the top, creating openings in the layer 54 at contact locations, and metallizing the surface to form contacts such as contact 15.

Many other benefits result from the above described layout and process. By locating the tunnelling or thin oxide region between the select transistor and the memory transistor, a stacked structure results which permits a smaller overall cell size and greater packing density on the chip. Since the thin oxide layer is defined with just one etch step, the dimensions may be smaller, more controllable, and predictable. This, in turn, means higher yields. The etching of hole 42 is inherently a more controllable process than etching the field oxide so, again, the thin oxide area may be better controlled. Since the thin oxide layer can be made smaller, its contribution to the capacitance between floating gate 16 and region 12 is reduced and gate 16 is more effectively controlled by control gate 30.

It should be understood that devices of the type disclosed herein often substitute such materials as thermal nitride and deposited nitride for the thin oxide layer 22 and the interpoly oxide layer 44. Accordingly, for the purposes of this specification and claims, the term oxide should be thought of as including nitride materials. Likewise, refractory metals or silicides may be used in place of the polysilicon in the gates. Hence, the term polysilicon should be interpreted to include these materials when used in the specification and claims. Of course, the invention applies to P channel devices as well. Many other variations will occur to those skilled in the art and we intend to be bound only to the appended claims.

What is claimed is:

1. A floating gate storage device for use with an electrically programmable and electrically erasable memory cell comprising:

a semiconductor substrate of one conductivity type;

first source and drain surface regions of the opposite conductivity type on said substrate;

a first channel region connecting said first source and drain surface regions;

a conductive floating gate insulated from all of the regions and having a first portion overlying said first channel region and a second portion overlapping at least one of said first source and drain regions in an overlap region wherein the first portion of the floating gate is connected to the second portion of the floating gate by separated dual paths disposed on opposite sides of the first channel region;

a tunnel region inside said overlap region having borders which are interior to and displaced from the borders of said overlap region;

a condutive control gate overlapping and insulated from said floating gate;

second source and drain surface regions of the opposite conductivity type on said substrate;

a second channel region connecting said second source and drain surface regions; and select gate means overlaying and insulated from said second channel region.

2. The device of claim 1 in which said select gate means comprises first and second electrically connected stacked select gates overlaying said second channel region.

3. The device of claim 1 in which said one conductivity type is P type, said floating gate and said control gate are polycrystalline silicon, and said gates are insulated from said substrate and from each other by oxide.

4. The device of claim 3 in which said tunnel region comprises a thin layer of oxide of substantially less thickness than the rest of the insulating oxide in said overlap region.

5. The device of claim 1 in which said one conductivity type is P type, said floating gate and said control gate are polycrystalline silicon, and said gates are insulated from said substrate and from each other by oxide.

6. The device of claim 5 in which said tunnel region comprises a thin layer of oxide of substantially less thickness than the rest of the insulating oxide in said overlap region.

7. The device of claim 1 in which said one conductivity type is P type, said floating gate and said select gate means and said control gate are polycrystalline silicon, and said gates are insulated from said substrate and from each other by oxide.

8. The device of claim 7 in which said tunnel region comprises a thin layer of oxide of substantially less thickness than the rest of the insulating oxide in said overlap region.

9. The device of claim 8 in which said overlap region is disposed between said first and second channel regions and substantially aligned therewith.

10. The device of claim 1 in which said overlap region is disposed between said first and second channel regions and substantially in line therewith.

* * * * *